United States Patent
Song et al.

(10) Patent No.: US 9,473,186 B2
(45) Date of Patent: Oct. 18, 2016

(54) METHOD OF CONTROLLING RECEIVER GAIN AUTOMATICALLY AND APPARATUS FOR AUTOMATIC GAIN CONTROL IN RECEIVER

(71) Applicant: GCT Semiconductor, Inc., San Jose, CA (US)

(72) Inventors: Inho Song, Seoul (KR); Ei Ho Lee, Seoul (KR); Ki Tae Moon, Seoul (KR)

(73) Assignee: GCT SEMICONDUCTOR, INC., San Jose, CA (US)

( * ) Notice: Subject to any disclaimer, the term of this patent is extended or adjusted under 35 U.S.C. 154(b) by 92 days.

(21) Appl. No.: 14/516,878

(22) Filed: Oct. 17, 2014

(65) Prior Publication Data

US 2015/0111513 A1 Apr. 23, 2015

(30) Foreign Application Priority Data

Oct. 18, 2013 (KR) .......................... 10-2013-0124496

(51) Int. Cl.
| | | |
|---|---|---|
| *H04B 1/12* | (2006.01) | |
| *H04B 1/16* | (2006.01) | |
| *H03F 3/189* | (2006.01) | |
| *H03G 3/30* | (2006.01) | |
| *H04B 1/04* | (2006.01) | |

(52) U.S. Cl.
CPC .............. *H04B 1/16* (2013.01); *H03F 3/189* (2013.01); *H03G 3/3068* (2013.01); *H03G 3/3078* (2013.01); *H03F 2200/294* (2013.01); *H04B 2001/0416* (2013.01)

(58) Field of Classification Search
CPC ........ H04B 1/10; H04B 1/16; H04B 1/1027; H04B 1/126; H04B 2100/0416; H03G 3/3052; H03G 3/3068; H03G 3/3078; H03M 1/185; H03F 3/189; H03F 2200/294
See application file for complete search history.

(56) References Cited

U.S. PATENT DOCUMENTS

| | | | | |
|---|---|---|---|---|
| 7,212,798 | B1 * | 5/2007 | Adams ................ | H03G 3/3068 330/278 |
| 8,913,975 | B2 * | 12/2014 | Deforeit ............... | H03G 3/3068 455/130 |
| 2010/0235707 | A1 * | 9/2010 | Su ........................ | H03G 3/3068 714/752 |
| 2011/0053543 | A1 * | 3/2011 | Schultz ................ | H03G 3/3068 455/245.1 |
| 2015/0207529 | A1 * | 7/2015 | Gander ................ | H04B 1/1027 455/234.1 |

FOREIGN PATENT DOCUMENTS

| | | |
|---|---|---|
| JP | 2001-186083 A | 7/2001 |
| KR | 10-2002-0000716 A | 1/2002 |

OTHER PUBLICATIONS

Korean Office Action for application No. KR10-2013-0124496 dated Aug. 12, 2014.

* cited by examiner

*Primary Examiner* — Thanh Le

(74) *Attorney, Agent, or Firm* — Muir Patent Law, PLLC

(57) ABSTRACT

A method of controlling an automatic gain in a receiver includes receiving an input signal through an antenna of the receiver, by an automatic gain control unit of the receiver, setting a final RF gain, and by the automatic gain control unit, setting an IF gain in a state that the final RF gain is set.

13 Claims, 5 Drawing Sheets

(a)

(b)

METHOD OF CONTROLLING RECEIVER GAIN AUTOMATICALLY AND APPARATUS FOR AUTOMATIC GAIN CONTROL IN RECEIVER

CROSS-REFERENCE TO RELATED APPLICATION

This application claims the benefit under 35 U.S.C. §119 (a) of Korean Patent Application No. 2013-0124496, filed on Oct. 18, 2013 in the Korean Intellectual Property Office, the entire disclosure of which is incorporated herein by reference for all purposes.

BACKGROUND

1. Field

The following description relates to a method of controlling an automatic gain in a receiver and an automatic gain controlling apparatus using the same.

2. Discussion of Related Art

A radio signal in wireless communication system may get distorted by the environment condition in which the signal travels, and such distortion needs to be compensated properly to guarantee enough receiver performance. AGC (Automatic Gain Control) is a basic compensation function, which maintains a constant internal signal strength regardless of the antenna input power to minimize performance loss in data processing.

In WLAN (Wireless Local Area Network) communication, smaller environmental effect on signal characteristics is expected since a narrower space and lower moving speed of terminals are assumed there. But WLAN receivers generally need to be always ready to detect other terminals as well as AP to support a carrier sense multiple access (CSMA) based access operation, and the antenna input power may change in a random and abrupt manner from packet to packet. Therefore, AGC operation must be completed individually for each packet and faster AGC algorithm would be favorable in WLAN receivers. The conventional AGC algorithm includes a binary tree search AGC algorithm, and an RSSI based AGC algorithm.

In general, AGC involves a process of receiver gain change and ADC input power measurement. Since the signal fluctuation may be caused by receiver gain change, some transient interval before ADC power measurement may be needed and there is a limit in reducing an AGC operation period for stable power measurement. In addition, the receiver gain may increase or decrease during a convergence process of the general AGC operation, so there is a need of a hysteresis area to better ensure a stable convergence even with some measurement errors or external noise factors. This need of a hysteresis area is also a limiting factor in enlarging the receiver dynamic range.

SUMMARY

A method of controlling automatic gain and an apparatus for automatic gain controlling in receiver for more stable and faster AGC convergence by minimizing the transient interval and removing the need of a hysteresis area are suggested hereafter.

In one general aspect, there is provided a method of controlling an automatic gain in a receiver, the method including: receiving an input signal through an antenna of the receiver; by an automatic gain control unit of the receiver, setting a final RF gain; and by the automatic gain control unit, setting an IF gain in a state that the final RF gain is set.

The setting of the final RF gain may include: setting a current RF gain as one of a highest gain section, a middle gain section, and a lowest gain section depending on a magnitude of gain; performing a gain control by setting the current RF gain as the final RF gain if an ADC signal power is lower than a reference value obtained by adding an AGC convergence target value to an IF gain control range, setting the current RF gain to be lowered one stage if the ADC signal power is equal to or higher than the reference value, and setting the lowest gain section as the final RF gain if the current RF gain is the lowest gain section, wherein the performing of the gain control may be repeated until the final RF gain is set.

In another general aspect, there is provided an apparatus for controlling an automatic gain with respect to an input signal in a receiver, the apparatus including: a receiving unit configured to receive an input signal; an amplifying unit configured to amplify the input signal; an analog-to-digital converter (ADC) unit configured to convert the amplified input signal; a target value storage unit configured to store an AGC convergence target value; and an automatic gain control (AGC) unit configured to adjust an RF gain and an IF gain by controlling the amplifying unit based on a signal power being output from the ADC unit and the AGC convergence target value, wherein the AGC unit sets a final RF gain, and in a state that the final RF gain is fixed, sets the IF gain.

The AGC unit may be configured to: set a current RF gain as one of a highest gain section, a middle gain section, and a lowest gain section depending on a magnitude of gain; and repeat a process, in which the current RF gain is set as the final RF gain if an ADC signal power is lower than a reference value obtained by adding the AGC convergence target value to an IF gain control range, the current RF gain is set to be lowered one stage if the ADC signal power is equal to or higher than the reference value, and the lowest gain section is set as the final RF gain if the current RF gain is the lowest gain section, until the final RF gain is set.

The AGC unit may be configured to: divide a magnitude of an RF gain into a highest gain section, a middle gain section, and a lowest gain section, and set a current RF gain to the highest gain section; set the RF gain to the middle gain section if an ADC signal power obtained after the RF gain is set to the highest gain section is equal to or larger than a reference value obtained by adding the AGC convergence target value to an IF gain control range, and set the highest gain section as the final RF gain if the ADC signal power obtained after the RF gain is set to the highest gain section is lower than the reference value; and set the lowest gain section as the final RF gain if an ADC signal power obtained after the RF gain is set to the middle gain section is equal to or larger than the reference value, and set the middle gain section as the final RF gain if the ADC signal power obtained after the RF gain is set to the middle gain section is lower than the reference value.

Figure 1:
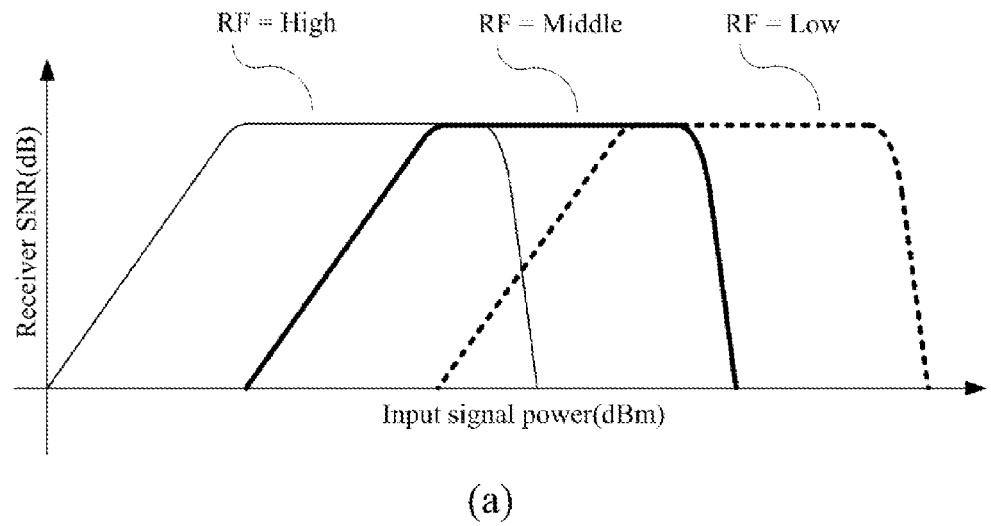
FIG. 1 (a) is a graph illustrating an example of SNR characteristics of a receiver according to an ideal gain switching, and FIG. 1 (b) is a graph illustrating an example of SNR dynamic characteristics degraded due to convergence errors during an AGC process.
Figure 1:
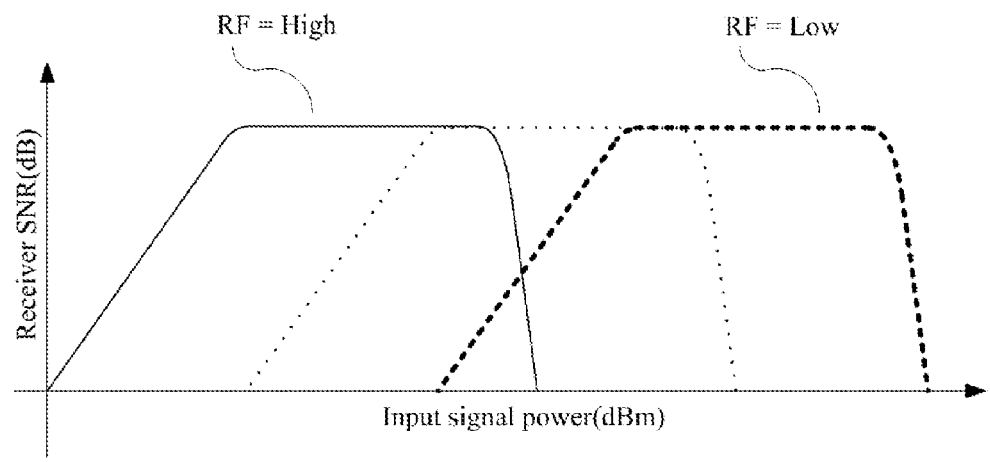

Throughout the drawings and the detailed description, unless otherwise described, the same drawing reference numerals will be understood to refer to the same elements, features, and structures. The relative size and depiction of these elements may be exaggerated for clarity, illustration, and convenience

DETAILED DESCRIPTION

The following detailed description is provided to assist the reader bar gaining a comprehensive understanding of the methods, apparatuses, and/or systems described herein. Accordingly, various changes, modifications, and equivalents of the systems, apparatuses and/or methods described herein will be suggested to those of ordinary skill in the art. Also, descriptions of well-known functions and constructions may be omitted for increased clarity and conciseness.

All terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly on defined herein.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

It should also be noted that in performing a method or an operating method, processes of the method may occur out of noted order unlike otherwise mentioned. In other words, the respective processes may be executed in the same order as the noted order, may be executed substantially concurrently, or may be executed in the reverse order.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

It will be understood that, although the terms first, second, etc. may be used herein to describe various elements, these elements should not be limited by these terms. Unless indicated otherwise, these terms are only used to distinguish one element from another. For example, a first circuit could be termed a second circuit, and, similarly, a second circuit could be termed a first circuit without departing from the teachings of the disclosure.

The techniques described below relate to an automatic gain control (AGC) scheme for improving drawbacks of the conventional AGC scheme. The techniques may be generally used for a receiver of a wireless network, in particular, useful for a WLAN receiver.

The techniques provides an AGC scheme that is more stable and faster than the conventional AGC scheme by minimizing variation of internal characteristics of a receiver and removing a need for a hysteresis section.

A gain of a receiver subjected to the AGC is largely divided into a radio frequency (RF) gain and an intermediate frequency (IF) gain. The RF gain is closely related to the reception performance, and converted in multiple stages according to received signal powers such that Spurious Free Dynamic Range (SFDR) and Signal to Noise Ratio (SNR) are optimized in all ranges of received signal power. IF stage gain is finely adjusted so as to compensate for an extra gain required to send an ADC input a designated signal power for each RF stage gain. In this manner, the AGC operation is completed.

In order to prevent a receiver gain from failing to stably converge at a certain input power section due to input signal power measurement errors or external noise factors during a process of controlling an RF gain and an IF gain, a hysteresis section typically needs to be set at constant intervals according to increase or decrease of an input signal power.

FIG. 1 ($a$) is a graph illustrating an example of SNR characteristics of a receiver according to an ideal gain switching, and FIG. 1 ($b$) is a graph illustrating an example of SNR dynamic characteristics degraded due to convergence errors during an AGC process.

The change in SNRs of a receiver according to an optimized gain switching of the receiver is shown in (a) of FIG. 1. In (a) of FIG. 1, a graph on the left portion represents a case in which a high RF gain (RF=high) is set, a graph on the middle portion represents a case in which a middle RF gain (RF=middle) is set, and a graph on the right portion represents a case in which a low RF gain (RF=low) is set. SNRs with the three levels of RF gains show that a proper switching of RF gains according to input signal powers may inhibit degradation of the receiver SNR.

As for a WLAN receiver, generally, a signal reception at a random time and a random power is required, and thus an independent AGC operation is performed on each packet without having information about a previous packet. In addition, a preamble section is not long, so there is a need of a fast AGC convergence for precise packet detection. In addition, a dynamic range support is typically required for reception amounts to 100 dB, so it is difficult to ensure an ideal received SNR dynamic range in a WLAN system as shown in (a) of FIG. 1. Accordingly, as shown in (b) of FIG. 1, the RF gain may not be properly determined due to AGC convergence errors. (b) of FIG. 1 represents a case in which a middle RF gain section is not determined, and accordingly, a SNR degradation section is observed.

According to the conventional AGC scheme, an RF stage gain is not distinguished from an IF stage gain when a gain change is performed to compensate for a received input power. In this case, the RF stage gain and the IF stage gain may be simultaneously changed, which leads to an abrupt change in internal characteristics of a receiver. A great amount of time is typically needed to stabilize such an abrupt change in characteristics, which increases a period of an AGC operation required for maintaining accuracy in measuring the same level of received signal power.

According to the conventional AGC scheme, an AGC convergence process is accompanied by a process of increasing/decreasing various gain combinations. Therefore, a hysteresis section having an input power varying with a direction of an input signal needs to be set at constant intervals in order to ensure a stable convergence and prevent performance degradation due to convergence errors. However, the size of the hysteresis section may be a direct factor reducing an available dynamic range of a receiver.

Recently, in order to increase the data transfer rate in WLAN, the 11n/ac standard and so on have defined a modulation scheme, such as 64QAM and 256QAM, which is highly efficient but has high SNR requirements. However, the high SNR requirement may intensify the above described drawbacks of the AGC.

These techniques obviate the need to simultaneously change the RF stage gain and the IF stage gain. To this end, a process of adjusting an RF gain is distinguished from a process of adjusting an IF gain.

Hereinafter, a method 100 of controlling an automatic gain with respect to an input signal in a receiver, and an apparatus 500 for controlling an automatic gain in a receiver will be described in detail with reference to the accompanying drawings.

Figure 2:
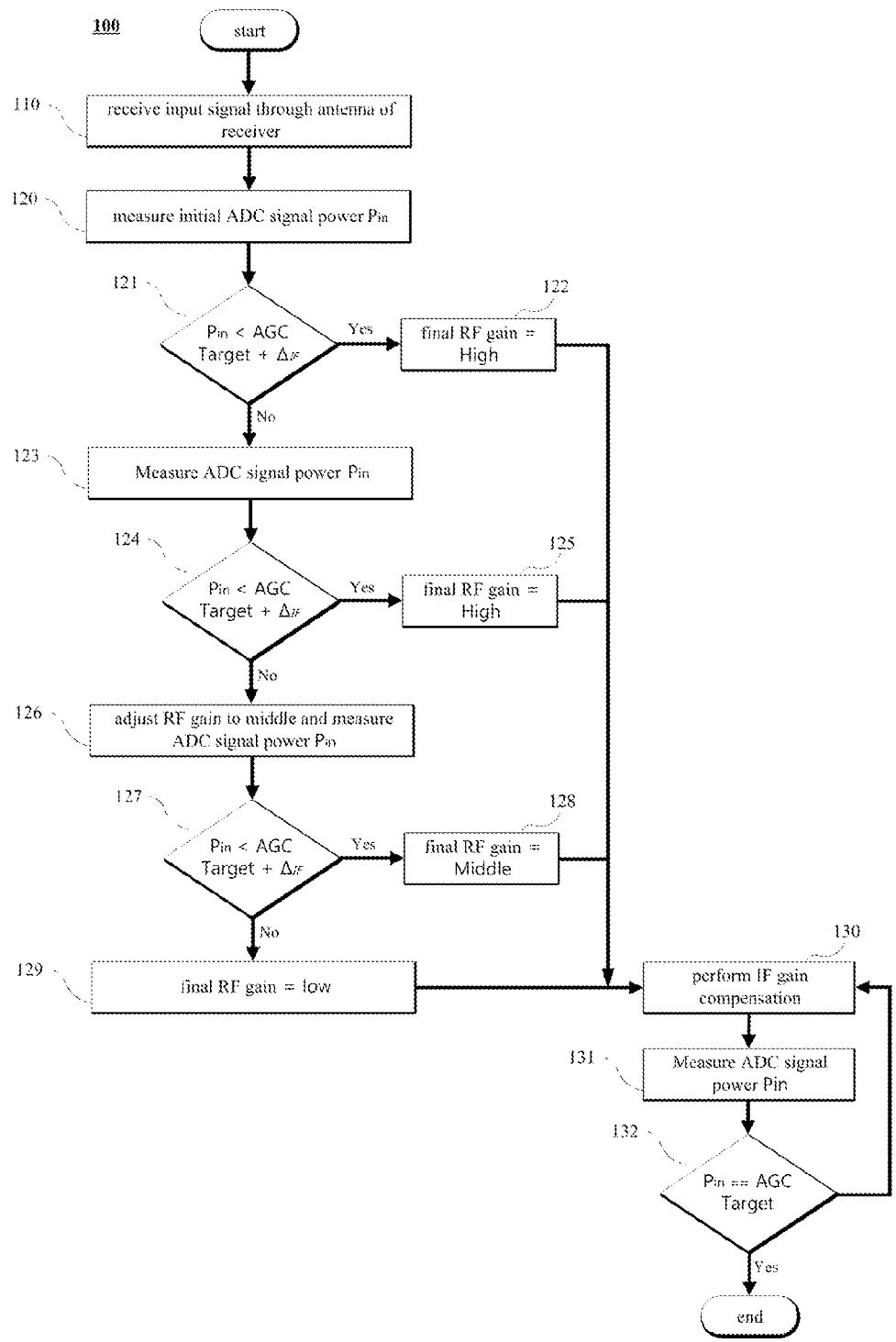
FIG. 2 is a flowchart illustrating an example of a method of controlling an automatic gain with respect to an input signal.

FIG. 2 is a flowchart illustrating an example of a method of controlling an automatic gain with respect to an input signal. FIG. 2 illustrates a case in which a magnitude of RF gain is divided into a highest gain section, a middle gain section, and a lowest gain section.

The method 100 of controlling an automatic gain with respect to an input signal in a receiver includes: receiving an input signal through an antenna of the receiver (110); by an automatic gain control (AGC) unit of the receiver, setting a final RF gain (120 to 129); and by the AGC unit, setting an IF gain in a state that the final RF gain is set (130 to 132).

Referring to FIG. 2, the setting of the final RF gain includes measuring an initial ADC signal power $P_{in}$ (120) and determining whether the measured initial ADC signal $P_{in}$ is equal to or higher than a value obtained by adding an IF gain control range IF to an AGC convergence target value, denoted as AGC Target (121).

The ADC signal power $P_{in}$ represents a power of a signal input into an Analog to Digital Converter (ADC) of a receiver. The AGC Target represents a target value determined in advance depending on a communication environment or a target performance of a receiver and desired to reach through a gain adjustment. The IF gain control range IF represents a range of an IF gain value that exceeds the AGC convergence target value with regard to a relation between the AGC convergence target value and the IF gain. That is, the IF gain control range IF is "IF gain−AGC Target". Meanwhile, hereinafter, a value obtained by adding the IF gain control range IF to the AGC Target will be referred to as a reference value.

The highest gain section is set as the final RF gain section if the ADC signal power $P_{in}$ is lower than the reference value (122), and an ADC signal power $P_{in}$ is repeatedly measured if the ADC signal power $P_{in}$ is equal to or higher than the reference value (123).

If the ADC signal power $P_{in}$ measured in operation 123 is lower than the reference value, the highest gain section is set as the final RF gain section (122), and if the ADC signal power $P_{in}$ is equal to or higher than the reference value, a current RF gain is adjusted to the middle gain section, and an ADC signal power $P_{in}$ after the RF gain adjustment is measured (126).

It is determined whether the ADC signal power $P_{in}$ measured in operation 126 is equal to or higher than the reference value (127), and if the ADC signal power $P_{in}$ measured in operation 126 is determined to be equal to or higher than the reference value, the lowest gain section is set as the final RF gain (129), and if the ADC signal power $P_{in}$ measured in operation 126 is determined to be lower than the reference value, the middle gain section is set as the final RF gain (128).

After the final RF gain is set in operation 122, 125, 128, or 129, an IF gain is adjusted. According to the example, the final RF gain is fixed and then the IF gain is adjusted, thereby minimizing the possibility of changing an RF gain and an IF gain at the same time.

The IF gain adjusting process includes performing an IF gain compensation (130), measuring an ADC signal power $P_{in}$ (131), and determining whether the ADC signal power $P_{in}$ converges at the AGC Target (132). If the ADC signal power $P_{in}$ does not converge at the AGC Target, a process of performing the IF gain compensation again and comparing an ADC signal power $P_{in}$ obtained after the IF gain compensation with the AGC Target is repeated.

The setting of the final RF gain may be implemented through another embodiment different from the embodiment shown in FIG. 2. For example, the setting of the final RF gain may include setting a current RF gain as one of the highest gain section, the middle gain section, and the lowest gain section depending on a magnitude of the gain in advance by a user or a system; and performing a gain control by setting the current RF gain as the final RF gain if an ADC signal power is lower than a reference value obtained by adding an IF gain control range to an AGC convergence target value, setting the current RF to be lowered one level if the ADC signal power is equal to or higher than the reference value, and setting the lowest gain section as the final RF gain if the current RF is the lowest gain section. In this case, the gain control may be repeatedly performed until the final RF gain is set.

In addition, the RF gain may be divided into different numbers of stages more than three stages as in FIG. 2. In this case, the ADC signal power $P_{in}$ is compared with the reference value, and if the ADC signal power $P_{in}$ is determined to be equal to or higher than the reference value, the current RF gain is adjusted to be lowered one stage, and if the ADC signal power $P_{in}$ is determined to be lower than the reference value, the current RF gain is set as the final RF gain. This process is repeated until the final RF gain is set.

Figure 3:
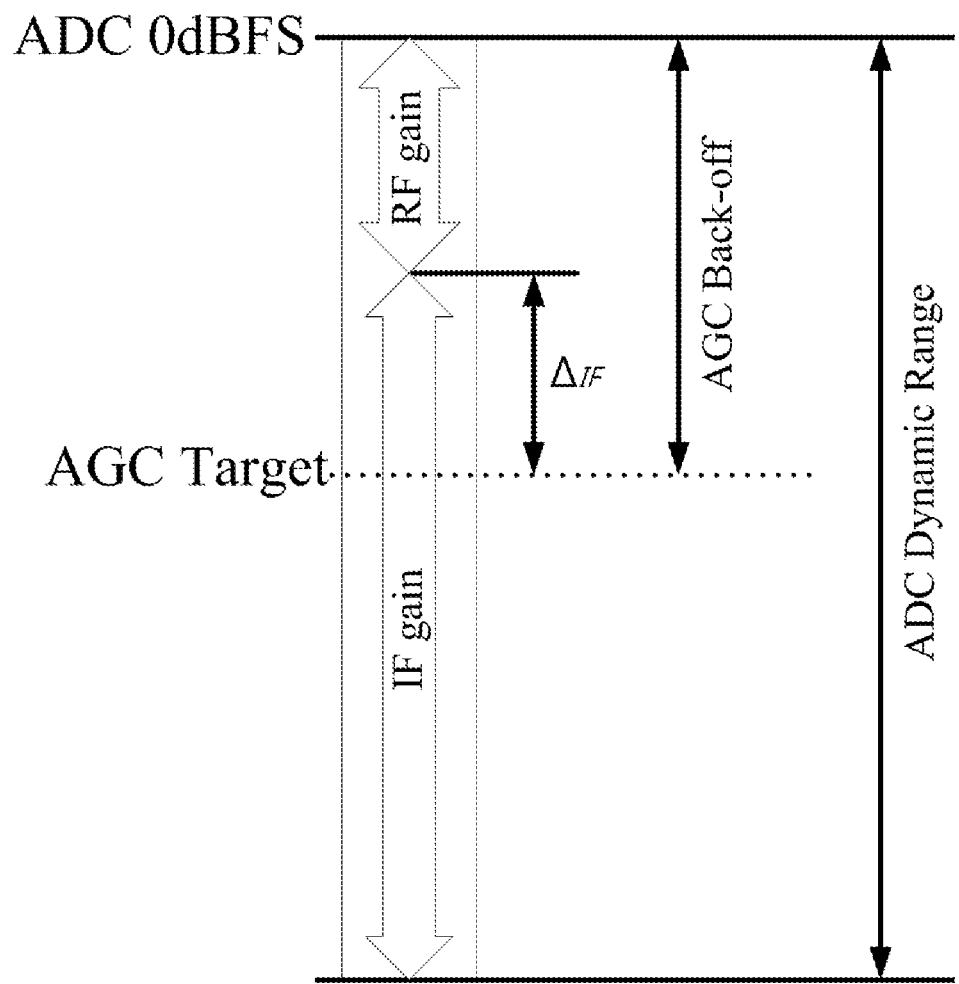
FIG. 3 is a drawing illustrating an example of a criterion for changing an RF gain in the AGC.

FIG. 3 is a drawing illustrating an example of a criterion for changing an RF gain in the AGC. As described above, an IF gain control range IF represents a range of an IF gain value that exceeds the AGC Target with regard to a relation between the AGC Target and the IF gain. The total range including the RF gain and the IF gain represents an ADC dynamic range.

Figure 4:
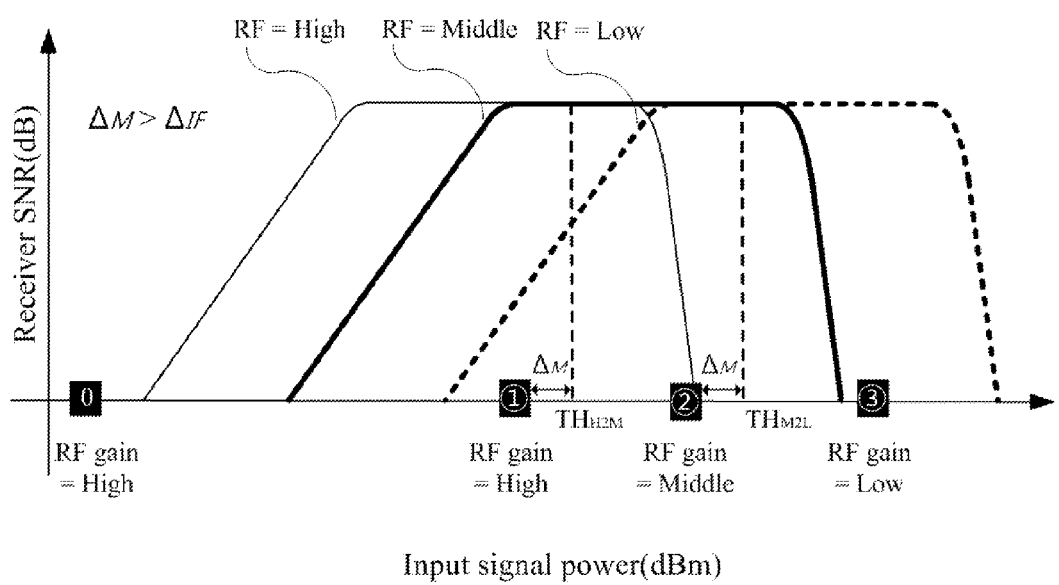
FIG. 4 is a graph illustrating an example of a point of time in which an ADC signal power is measured and evaluated to determine an RF gain.

FIG. 4 is a graph illustrating an example of a point of time in which an ADC signal power is measured and evaluated to determine an RF gain. The example of FIG. 4 corresponds to the AGC process shown in FIG. 2.

According to the example, a gain convergence for a receiver is performed such that an RF stage gain and an IF stage gain are distinguished and sequentially changed and determined. The numbers denoted in FIG. 4 represents the position and order in which measurement of an ADC signal power is performed and comparison between an ADC signal power and a reference value is performed to determine an RF gain. Number 0 represents a point at which an ADC signal power is initially measured and compared with the reference value (corresponding to operations 120, 121, and 122 of FIG. 2), Number 1 represents a point at which an RF gain is positioned between the highest gain section (HIGH) and the middle gain section (Middle) (corresponding to operations 123, 124, and 125 of FIG. 2), and Number 2 represents a point of time at which the RF gain is positioned between the middle gain section (Middle) and the lowest gain section (Low) (corresponding to operations 126, 127, and 128 of FIG. 2). Number 3 represents a point of time corresponding to a case shown in FIG. 2 having the lowest gain section set as the final RF gain.

The point of time at which each ADC signal power is measured and compared with the reference value to determine the final RF gain or adjust the current RF gain to a lower level (Number 2 or 3) may be set such that the largest value is provided within a range in which SNR degradation is not caused due to an IF gain change during a convergence process of RF gain condition, thereby enabling an available SNR dynamic range to be maximized. That is, the process of measuring and analyzing the ADC signal power may be performed at the earliest point of time within a range having no SNR degradation.

Referring to FIG. 4, $TH_{H2M}$ represents a point at which an RF gain is provided between the highest gain section and the middle gain section, and the process of Number 1 is performed at a point that is spaced apart from $TH_{H2M}$ by $_M$. Meanwhile, $_M$ is larger than $_{IF}$. That is, the process of Number 1 is performed at a point deviated from a point having a chance of an SNR degradation due to an IF gain change. For the same reason, the process of Number 2 is performed at a point that is spaced apart by $_M$ from $TH_{M2L}$ at which an RF gain is provided between the middle gain section and the lowest gain section.

The graph shown in FIG. 4 corresponds to the AGC operation described above with reference to FIG. 2. In case the RF gain adjustment is performed in other numbers of stages than three stages as in FIG. 2, the process of measuring the ADC signal power and comparing the ADC signal power with the reference value may be provided to the largest value within a range in which SNR degradation due to IF gain change does not occur.

Figure 5:
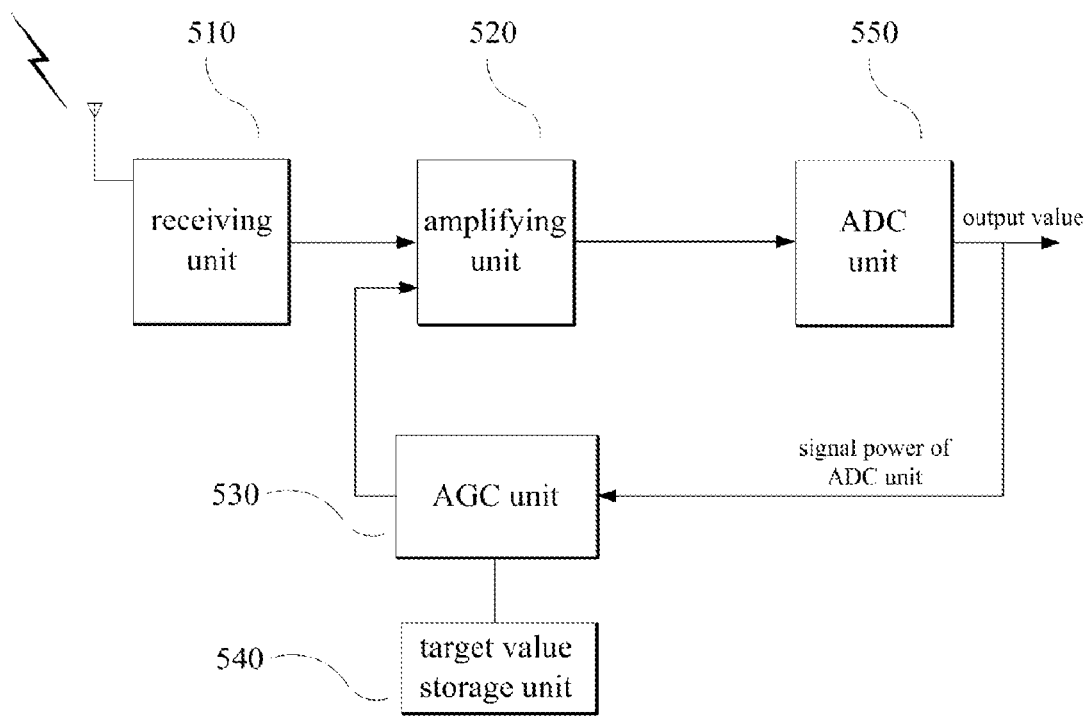
FIG. 5 is a block diagram illustrating a configuration of an apparatus for controlling an automatic gain of a receiver.

FIG. 5 is a block diagram illustrating a configuration of an apparatus for controlling an automatic gain of a receiver. The apparatus 500 for controlling an automatic gain includes a receiving unit 510 to receive an input signal, an amplifying unit 520 to amplify the input signal, an ADC unit 550 to convert the amplified input signal, a target value storage unit 540 to store an AGC convergence target value and an automatic gain control (AGC) unit 530 to adjust an RF gain and an IF gain by controlling the amplifying unit 520 based on an output signal power of the ADC unit 550 and the AGC convergence target value. The various units described herein may be implemented and configured using various known circuitry elements to form circuits.

The receiving unit 510 includes an antenna and an RF receiver. Although not shown in FIG. 5, the receiver may include a mixer, a filter, and a local oscillator (LO) used in association with an AGC of the receiver.

The AGC unit 530 serves as a primary device to perform the above described method 100 of controlling an automatic gain with respect to an input signal in the receiver. In the following description, the details or parts identical to those of the method 100 will be omitted or briefly described.

The AGC unit 530 may set a current RF gain as one of a highest gain section, a middle gain section, and a lowest gain section depending on a magnitude of gain, and repeat a process, in which the current RF gain is set as the final RF gain if an ADC signal power is lower than a reference value obtained by adding an AGC convergence target value to an IF gain control range, the current RF gain is set to be lowered one level if the ADC signal power is equal to or higher than the reference value, and the lowest gain section is set as the final RF gain if the current RF gain is the lowest gain section, until the final RF gain is set.

In addition, the AGC unit 530 may be configured to: divide a magnitude of an RF gain into a highest gain section, a middle gain section, and a lowest gain section, and set a current RF gain to the highest gain section; set the RF gain to the middle gain section if an ADC signal power obtained after the RF gain is set to the highest gain section is equal to or larger than a reference value obtained by adding an AGC convergence target value to an IF gain control range, and set the highest gain section as the final RF gain if the ADC signal power obtained after the RF gain is set to the highest gain section is lower than the reference value; and set the lowest gain section as the final RF gain if an ADC signal power obtained after the RF gain is set to the middle gain section is equal to or larger than the reference value, and set the middle gain section as the final RF gain if the ADC signal power obtained after the RF gain is set to the middle gain section is lower than the reference value.

The AGC unit 530 adjusts the IF gain such that an ADC signal power converges at an AGC convergence target value after the RF gain is set.

According to the technology described below, an RF gain is adjusted, and in a state that the RF gain is fixed, an IF gain is adjusted, so that a stable AGC is achieved. In addition, a hysteresis section is removed or minimized, so that a faster AGC is achieved.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A method of controlling a receiver gain automatically, the method comprising:
   receiving an input signal through an antenna of the receiver;
   by an automatic gain control unit of the receiver, setting a target radio frequency (RF) gain; and
   by the automatic gain control unit, setting an intermediate frequency (IF) gain in a state that the target RF gain is set, wherein in the setting of the IF gain, the IF gain is adjusted such that an analog-to-digital (ADC) signal power converges at an automatic gain control (AGC) convergence target value.

2. The method of claim 1, wherein the setting of the target RF gain comprises:
   determining an initial RF gain; and
   setting a value lowered from the initial RF gain in consideration of an analog-to-digital converter (ADC) signal power, an AGC convergence target value, and an IF gain control range or the initial RF gain as the target RF gain.

3. The method of claim 2, wherein the IF gain control range represents a range of the IF gain value that exceeds the AGC convergence target value.

4. The method of claim 1, wherein the setting of the target RF gain comprises:
   setting a current RF gain as one of a highest gain section, a middle gain section, and a lowest gain section depending on a magnitude of gain;
   performing a gain control by setting the current RF gain as the target RF gain if an ADC signal power is lower than a reference value obtained by adding an AGC convergence target value to an IF gain control range, setting the current RF gain to be lowered one stage if the ADC signal power is equal to or higher than the reference value, and setting the lowest gain section as the target RF gain if the current RF gain is the lowest gain section,
   wherein the performing of the gain control is repeated until the target RF gain is set.

5. The method of claim 1, wherein the setting of the target RF gain comprises:
   dividing a magnitude of an RF gain into a highest gain section, a middle gain section, and a lowest gain section, and setting the RF gain to the highest gain section;
   setting the RF gain to the middle gain section if an ADC signal power obtained after the RF gain is set to the highest gain section is equal to or larger than a reference value obtained by adding an AGC convergence target value to an IF gain control range, and setting the highest gain section as the target RF gain if the ADC signal power obtained after the RF gain is set to the highest gain section is lower than the reference value; and
   setting the target RF gain to the lowest gain section if an ADC signal power obtained after the RF gain is set to the middle gain section is equal to or larger than the reference value, and setting the middle gain section as the target RF gain if the ADC signal power obtained after the RF gain is set to the middle gain section is lower than the reference value.

6. The method of claim 1, wherein the setting of the target RF gain comprises:
   dividing an RF gain into a plurality of sections depending on a magnitude of gain, and setting a current RF gain to one of the plurality of sections; and
   performing a gain control by setting the current RF gain as the target RF gain if an ADC signal power is lower than a reference value obtained by adding an AGC convergence target value to an IF gain control range, setting the current RF gain to be lowered one stage if the ADC signal power is equal to or higher than the reference value, and setting a lowest gain section as the target RF gain if the current RF gain is the lowest gain section,
   wherein the performing of the gain control is repeated until the target RF gain is set.

7. The method of claim 6, wherein the performing of the gain control,
   a point of time to adjust a current RF gain is an earliest point of time within a range in which a SNR degradation due to an IF gain control does not occur.

8. An apparatus for an automatic gain control with respect to an input signal in a receiver, the apparatus comprising:
   a receiving unit configured to receive an input signal;
   an amplifying unit configured to amplify the input signal;
   an analog-to-digital converter (ADC) unit configured to convert the amplified input signal;
   a target value storage unit configured to store an AGC convergence target value; and
   an automatic gain control (AGC) unit configured to adjust an RF gain and an IF gain by controlling the amplifying unit based on a signal power being output from the ADC unit and the AGC convergence target value,
   wherein the AGC unit sets a target RF gain, and in a state that the target RF gain is fixed, sets the IF gain, and
   wherein the AGC unit adjusts the IF gain such that an ADC signal power converges at the AGC convergence target value after the RF gain is set.

9. The apparatus of claim 8, wherein the AGC unit is configured to:
   set a current RF gain as one of a highest gain section, a middle gain section, and a lowest gain section depending on a magnitude of gain; and
   repeat a process, in which the current RF gain is set as the target RF gain if an ADC signal power is lower than a reference value obtained by adding the AGC convergence target value to an IF gain control range, the current RF gain is set to be lowered one stage if the ADC signal power is equal to or higher than the reference value, and the lowest gain section is set as the target RF gain if the current RF gain is the lowest gain section, until the target RF gain is set.

10. The apparatus of claim 9, wherein the IF gain control range represents a range of the IF gain value that exceeds the AGC convergence target value.

11. The apparatus of claim 8, wherein the AGC unit is configured to:
    divide a magnitude of an RF gain into a highest gain section, a middle gain section, and a lowest gain section, and set a current RF gain to the highest gain section;
    set the RF gain to the middle gain section if an ADC signal power obtained after the RF gain is set to the highest gain section is equal to or larger than a reference value obtained by adding the AGC convergence target value to an IF gain control range, and set the highest gain section as the target RF gain if the ADC signal power obtained after the RF gain is set to the highest gain section is lower than the reference value; and
    set the lowest gain section as the target RF gain if an ADC signal power obtained after the RF gain is set to the middle gain section is equal to or larger than the reference value, and set the middle gain section as the target RF gain if the ADC signal power obtained after the RF gain is set to the middle gain section is lower than the reference value.

12. The apparatus of claim 11, wherein when the AGC unit adjusts the target RF gain, a time to adjust a current RF gain is an earliest point of time within a range in which a SNR degradation due to an IF gain control does not occur.

13. The apparatus of claim 8, wherein the AGC unit is configured to:
    divide an RF gain into a plurality of sections depending on a magnitude of gain, and set a current RF gain to one of the plurality of sections; and
    set the RF gain to a middle gain section if an ADC signal power obtained after the RF gain is set to a highest gain section is equal to or larger than a reference value obtained by adding the AGC convergence target value to an IF gain control range, and set the highest gain section as the target RF gain if the ADC signal power obtained after the RF gain is set to the highest gain section is lower than the reference value; and set the target RF gain to a lowest gain section if an ADC signal power obtained after the RF gain is set to the middle gain section is equal to or larger than the reference value, and set the middle gain section as the target RF gain if the ADC signal power obtained after the RF gain is set to the middle gain section is lower than the reference value.

* * * * *